(12) United States Patent
Kim et al.

(10) Patent No.: US 7,148,509 B2
(45) Date of Patent: Dec. 12, 2006

(54) THIN FILM TRANSISTOR ARRAY PANEL FOR DISPLAY

(75) Inventors: Chul-Ho Kim, Uiieongbu-si (KR); Il-Gon Kim, Seoul (KR); Cheol-Min Kim, Seongnam-si (KR); Tae-Hyeong Park, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 6 days.

(21) Appl. No.: 11/002,617

(22) Filed: Dec. 3, 2004

(65) Prior Publication Data

US 2005/0174846 A1   Aug. 11, 2005

(30) Foreign Application Priority Data

Dec. 3, 2003   (KR)   ............... 10-2003-0087125

(51) Int. Cl.
*H01L 29/04*   (2006.01)
*H01L 29/15*   (2006.01)
*H01L 31/036*   (2006.01)
*H01L 29/10*   (2006.01)
*H01L 31/113*   (2006.01)

(52) U.S. Cl. ................ 257/72; 257/57; 257/59; 257/66; 257/88; 257/291; 257/292; 257/293; 257/294; 257/347

(58) Field of Classification Search .......... 257/59, 257/72, 291–294, 57, 66, 88, 347
See application file for complete search history.

(56) References Cited

U.S. PATENT DOCUMENTS

| | | | | |
|---|---|---|---|---|
| 4,040,073 A | * | 8/1977 | Luo | ............ 257/66 |
| 5,821,138 A | * | 10/1998 | Yamazaki et al. | ........ 438/166 |
| 5,847,781 A | * | 12/1998 | Ono et al. | ........ 349/44 |
| 6,028,333 A | * | 2/2000 | Yamazaki et al. | ........ 257/296 |
| 6,365,444 B1 | * | 4/2002 | Chen et al. | ........ 438/149 |
| 6,969,872 B1 | * | 11/2005 | Kim | ........ 257/72 |
| 2002/0056838 A1 | * | 5/2002 | Ogawa | ........ 257/59 |
| 2003/0013280 A1 | * | 1/2003 | Yamanaka | ........ 438/487 |
| 2003/0059986 A1 | * | 3/2003 | Shibata | ........ 438/149 |
| 2003/0137621 A1 | * | 7/2003 | Zhang et al. | ........ 349/106 |
| 2003/0230749 A1 | * | 12/2003 | Isobe et al. | ........ 257/59 |
| 2004/0095549 A1 | * | 5/2004 | Moon | ........ 349/192 |
| 2004/0140469 A1 | * | 7/2004 | Liao et al. | ........ 257/72 |
| 2004/0169781 A1 | * | 9/2004 | Lee et al. | ........ 349/54 |
| 2005/0157220 A1 | * | 7/2005 | Kim | ........ 349/38 |
| 2005/0242351 A1 | * | 11/2005 | Kim | ........ 257/59 |

* cited by examiner

*Primary Examiner*—Ida M. Soward
(74) *Attorney, Agent, or Firm*—F. Chau & Associates, LLC

(57) ABSTRACT

A TFT array panel is provided, including an insulating substrate, gate lines horizontally provided on the insulating substrate, data lines isolated from the gate lines and intersecting the gate lines, a pixel electrode in a pixel region defined by intersecting the gate lines and data lines, a TFT for transmitting or intercepting an image signal transmitted through the plurality of data lines to the pixel electrode in response to a scanning signal transmitted from the plurality of gate lines, a transmission gate for distributing the image signal input from an input line to the plurality of data lines, and a repair line intersecting the input line of the transmission gate. Therefore, since the input repair line and the input line of the transmission gate are intersected, a parasitic capacitance occurring between the repair line and the input line of the transmission gate can be reduced.

7 Claims, 6 Drawing Sheets

THIN FILM TRANSISTOR ARRAY PANEL FOR DISPLAY

BACKGROUND OF THE INVENTION (a) Field of the Invention

The present invention relates to a thin film transistor array panel for a display.

(b) Description of the Related Art

A thin film transistor (TFT) array panel includes gate lines horizontally disposed on an insulating substrate, an gate insulating layer on the gate lines, a semiconductor pattern on the gate insulating layer located over a gate electrode of the gate line, contact layers spaced apart from each other centering the gate lines on the semiconductor pattern, and data lines vertically disposed on the gate insulating layer. In the data lines, a source electrode extends to the upper portion of one end of the contact layer in a branch-shape, and a drain electrode is provided on the other portion of the contact layer and connected to a pixel electrode. Generally, the pixel electrode is provided on a protection layer covering the drain electrode and the data line, etc., and connected to the drain electrode through a contact hole formed in the protection layer.

In the TFT array panel, repair lines are provided in the vicinity of active regions where the gate line and the data line are intersected, to prevent a malfunction that may occur due to disconnection of the data line or a short-circuit between the gate line and the data line. For example, when a gate line and data line are short-circuited, it can be repaired by connecting both ends of the short-circuited data line to the repair line and disconnecting both ends of the short-circuited data line using a laser beam. However, the method using the repair lines can bring a problem of resistance capacitance (RC) delay according to increase of LCD size.

SUMMARY OF THE INVENTION

The technical objective of the present invention is to resolve RC delay of the repair line in a TFT array panel for a display.

To achieve the objective, the present invention provides a TFT array panel for a display having a repair line in an input terminal of a transmission gate.

In detail, the present invention provides a TFT array panel comprising: an insulating substrate; gate lines horizontally provided on the insulating substrate; data lines isolated from the gate line and intersecting the gate lines; a pixel electrode in a pixel region defined by intersecting the gate lines and data lines; a TFT for transmitting or intercepting an image signal transmitted through the plurality of data lines to the pixel electrode in response to a scanning signal transmitted from the plurality of gate lines; a transmission gate for distributing the image signal input from an input line to the plurality of data lines; and a repair line intersecting the input line of the transmission gate.

In the structure, it is preferable that the repair line is divided with an input terminal repair line and an end repair line, and that a repair transmission gate is further included in the TFT array panel to connect the input repair line with the end repair line. The transmission gate includes a plurality of TFTs having each output terminal connected to each data line, each input terminal connected to the transmission gate input line, and each gate terminal connected to the scanning signal lines of the transmission gate. The repair transmission gate may include an output terminal connected to the end repair line, an input terminal connected to the input repair line, and a gate terminal overlapped with gate terminal connecting pieces connected to the transmission gate scanning signal lines. Here, three input terminals of the transmission gate form a set and are connected to the input line of the transmission gate. There are three transmission gate scanning signal lines, and they may be connected to three gate terminals of the transmission gate, respectively, corresponding to a set of the input terminals. There are three gate terminal connecting pieces overlapped with the gate terminals of the repair transmission gate and they can be connected to three transmission gate scanning signal lines, respectively. In addition, diodes may be further included to connect the input line of the transmission gate and the input terminal of the repair transmission gate with a power supply line. Also, the length of channels of the repair transmission gate is longer than that of the channels of the transmission gate.

DETAILED DESCRIPTION OF THE PREFERRED EMBODIMENTS

Figure 1:
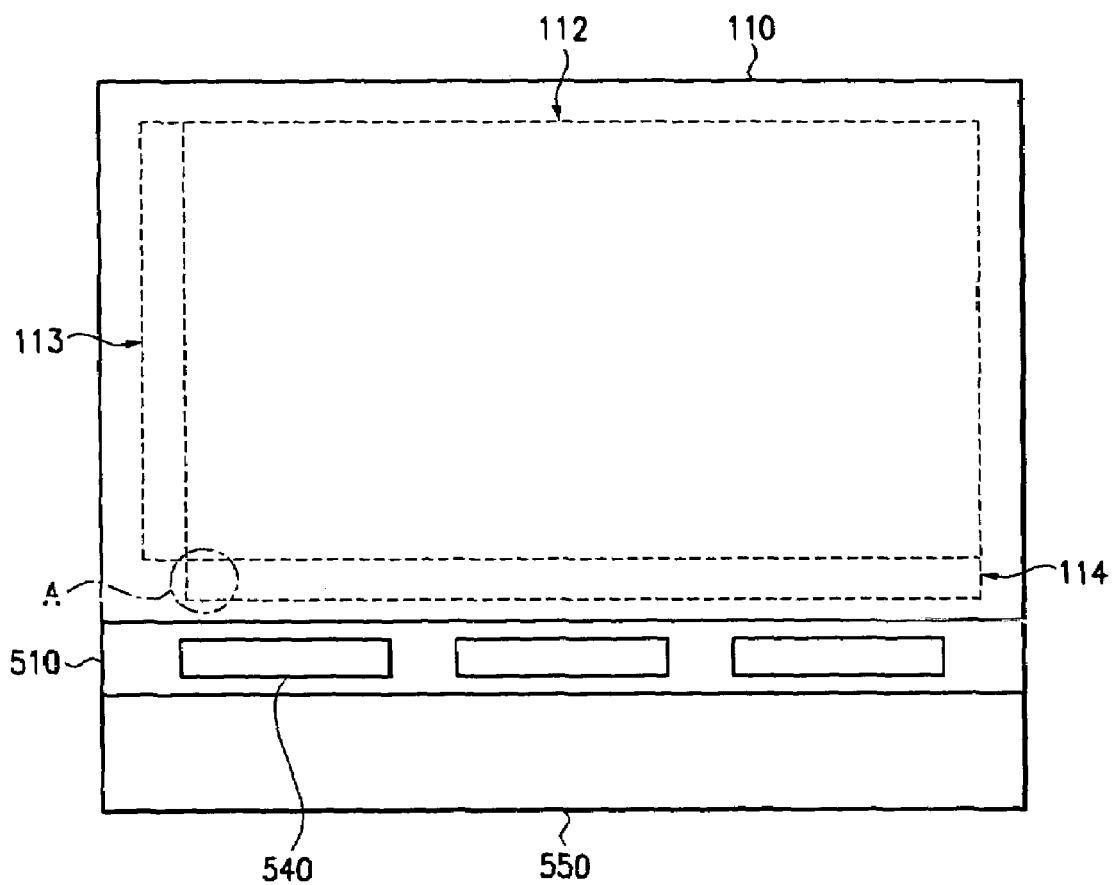
FIG. 1 is a plane diagram of a thin film transistor array panel according to an embodiment of the present invention.

Hereinafter, a preferred embodiment of the present invention will be described with reference to the accompanying drawings.

In the drawings, the thickness of several layers and regions are enlarged to show them more clearly, and similar elements have the same reference numbers throughout the specification. In addition, the expression that a layer, region, board, or panel is "on" something may mean the case when it is not only directly on something, but that something else may be provided therebetween. In addition, the expression that something is "under" something means there is nothing interposed therebetween.

The TFT array panel of the present invention can be applied to LCDs, OLEDs, etc. However, the embodiment of the present invention will be described defining a LCD.

Figure 2:
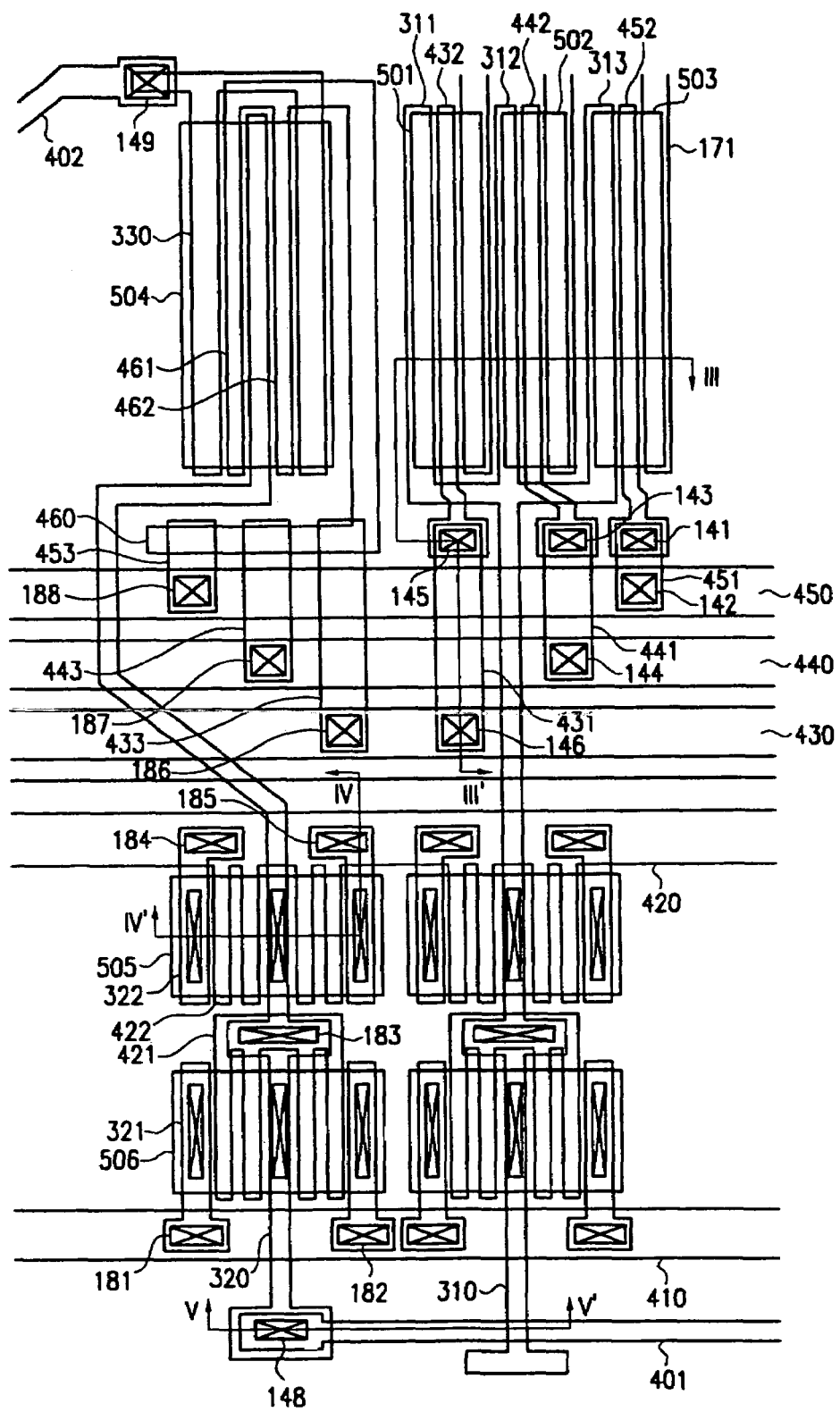
FIG. 2 is a diagram enlarging a portion of "A" in FIG. 1.

FIG. 1 is a plane diagram of a thin film transistor array panel according to an embodiment of the present invention, and FIG. 2 is a diagram enlarging a portion of "A" in FIG. 1.

A TFT array panel of the embodiment of the present invention comprises upper and lower display panels, and liquid crystal injected between the two panels.

FIG. 1 shows only a connection state of the lower display panel and a driving circuit unit, to allow the essential points of the present invention to be made clearly.

On an insulating layer 110, gate lines and data lines (not shown) are intersected, and a display region 112 having a TFT and a pixel electrode is provided. A gate line driving part 113 is provided on the left of the display region 112, and a transmission gate part 114, which is a portion of the data line driving circuit part, is provided on the lower portion of the display region 112. A flexible circuit board 510 having driving chips 540 thereon is provided on the lower portion of the insulating substrate 110, and a printed circuit board 550 is provided on the lower portion of the flexible circuit board 510. Accordingly, the flexible circuit board 510 connects the insulating substrate 110 with the printed circuit board 550.

Referring to FIG. 2, TFTs, of which output terminals are connected to the data lines 171, are provided to individually correspond to the data lines 171. Three input terminals 311, 312, and 313 of the TFT become a set and are connected to an input line 310 of the transmission gate. Three gate terminals 432, 442, and 452 of the TFT are connected to the first, second, and third transmission gate scanning lines 430, 440, and 450, respectively. The transmission gate distributes the image signals from the input line 310 of the transmission gate to three data lines 171 in response to the transmission gate scanning signals.

The input line 310 of the transmission gate intersects a Vdd line 420 and a Vss line 410 as power supply lines. Two kinds of diodes are provided between the Vdd line 420 and the Vss line 410: one allows a current flows from the Vdd line 420 to the input line 310 of the transmission gate; and the other allows a current flows from the input line 310 of the transmission gate to the Vss line 410. These diodes either disperse static electricity coming in from the display panel to the entire display panel or emit it to the outside.

An input repair line 401 is provided outside the Vss line 410, and it intersects the input line 310 of the transmission gate. Thus, when a repair is required, the input repair line 401 and the input line 310 of the transmission gate can be short-circuited by irradiating a laser beam to the intersection of the input repair line 401 and the input line 310 of the transmission gate.

A repair transmission gate is provided on the left of the leftmost transmission gate, and includes a TFT having a remarkably long channel. This TFT channel is about two times as long as the TFT channel of a common transmission gate. Accordingly, resistance of this TFT becomes about half of that of the TFT of the common transmission gate.

In the repair transmission gate, an input terminal line 320 is connected to the input repair line 401, and an output terminal line 330 is connected to an end repair line 402. The end repair line 402 is provided to intersect the end portions of the data lines 171, detouring around the display region 112. Gate terminals 461 and 462 are connected to a gate terminal line 460.

The gate terminal line 460 of the repair transmission gate is overlapped with all of the first, second, and third gate terminal connecting pieces 433, 443, and 453 connected to the first, second, and third transmission gate scanning lines 430, 440, and 450, respectively. This structure is to short-circuit the gate terminal line 460 and one of the gate terminal connecting pieces 433, 443, and 453 by irradiating a laser beam thereto, in repairing the data line 171 using the repair lines 401 and 402. Thus, the repair transmission gate operates by being synchronized with the corresponding transmission gate scanning signal.

The input terminal line 320 of the repair transmission gate is connected to the Vdd line 420 and Vss line 410 through two kinds of diodes. One of the diodes allows a current flows from the Vdd line 420 to the input terminal line 320 of the repair transmission gate, and the other allows a current flows from the input terminal line 320 to the Vss line 410. These diodes either disperse static electricity coming in from the display panel to the entire display panel, or emit it to the outside.

Hereinafter, a structure of the transmission gate 114 will be described in more detail with reference to the figures.

Figure 3:
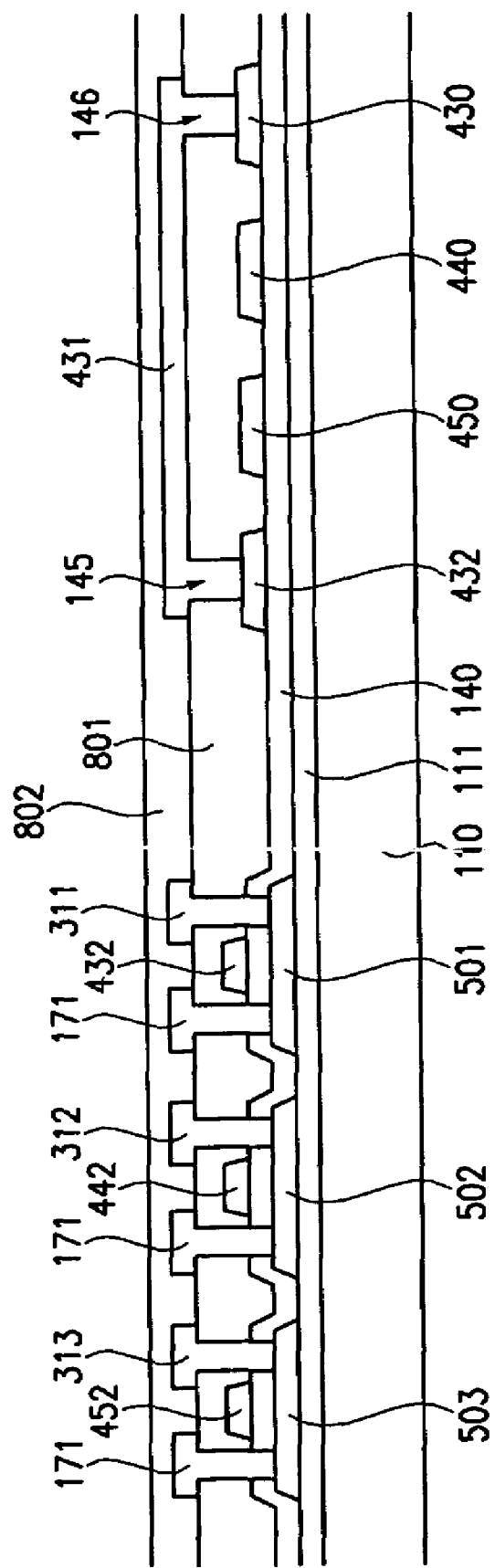
FIG. 3 is a cross-sectional view cut along III–III' in FIG. 1
Figure 4:
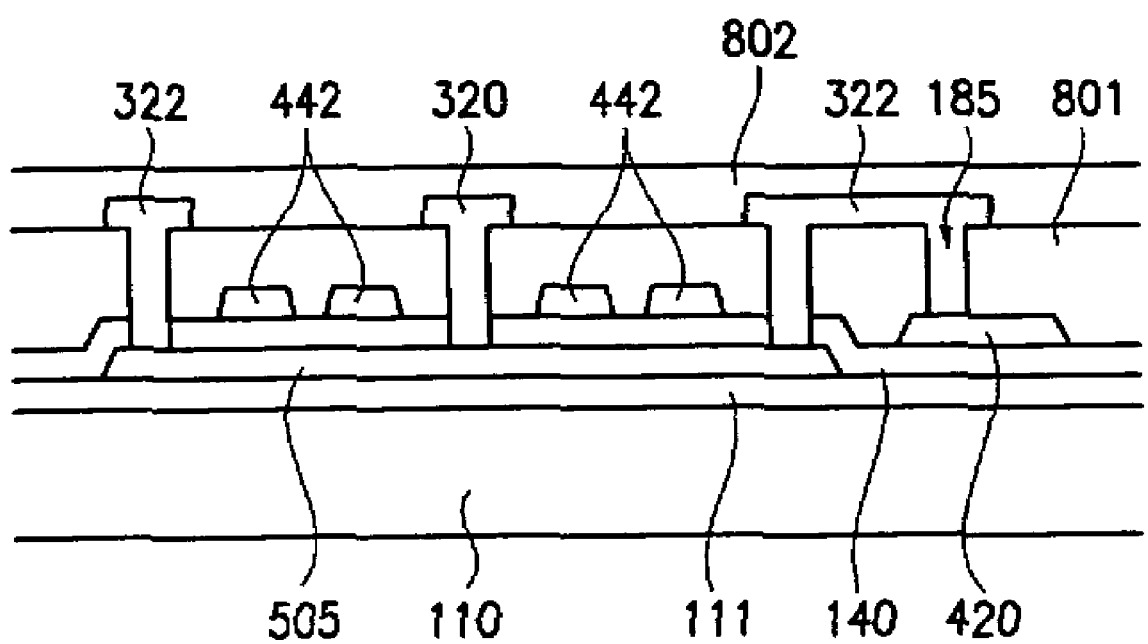
FIG. 4 is a cross-sectional view cut along IV–IV' in FIG. 1
Figure 5:
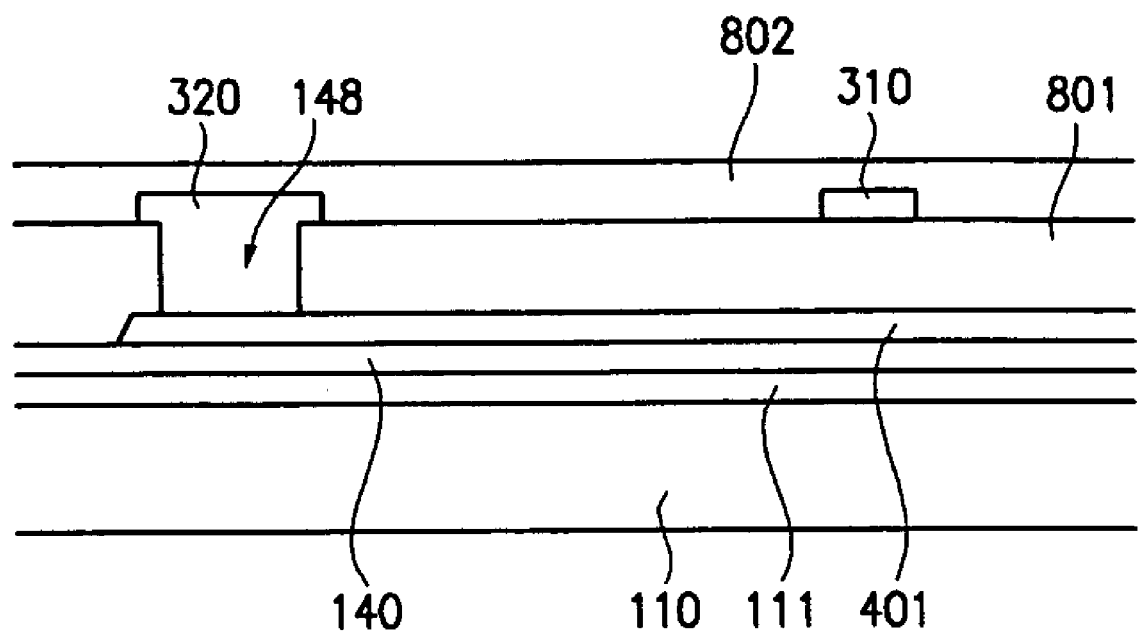
FIG. 5 is a cross-sectional view cut along V–V' in FIG. 1.

FIG. 3 is a cross-sectional view cut along II–II' in FIG. 1, FIG. 4 is a cross-sectional view cut along IV–IV' in FIG. 1, and FIG. 5 is a cross-sectional view cut along V–V' in FIG. 1.

A buffer layer 111 is provided on the insulating layer 110. Polycrystalline silicon layers 501, 502, 503, 504, 505, and 506 are provided on the buffer layer 111 to form channels of TFTs and diodes. A gate insulating layer 140 is provided on the polycrystalline silicon layers 501 to 506. In this structure, the polycrystalline silicon layers 501 to 506 include n-type or p-type impurities doped on the source and drain regions, and impurity-undoped channel regions.

On the gate insulating layer 140, there are provided gate lines (not shown) in the display region, the gate terminals 432, 442, and 452 of the TFTs, the first, second, and third transmission gate scanning lines 430, 440, and 450, the Vdd line 420, the Vss line 410, the repair lines 401 and 402, the gate terminal line 460 of the repair transmission gate, gate electrodes 421 and 422 of the diodes, and a first interlayer-insulating layer 801.

On the first interlayer-insulating layer 801, there are provided the data lines 171, the input terminals 311, 312, and 313 of the TFT, the input line 310 of the transmission gate, the first, second, and third gate terminal connecting pieces 431, 441, and 451 of the transmission gate, the output terminal line 330 of the repair transmission gate, the input terminal line 320 of the repair transmission gate, the first, second, and third gate terminal connecting pieces 433, 443, and 453 of the repair transmission gate and the source electrode 322 and the drain electrode 321 of the diode.

The data lines 171 are connected to the drain regions of the polycrystalline silicon layers 501, 502, and 503 through contact holes, and the input terminals 311, 312, and 313 of the TFT are connected to the source regions of the polycrystalline silicon layers 501, 502, and 503 through contact holes.

The first, second, and third gate terminal connecting pieces 431, 441, and 451 of the transmission gate are connected to the gate terminals 432, 442, and 452 of the TFT and the first, second, and third transmission gate scanning lines 430, 440, and 450 through the contact holes 141 to 146, to electrically connect the gate terminals 432, 442, and 452 with the first, second, and third transmission gate scanning lines 430, 440, and 450.

The output terminal line 330 of the repair transmission gate is connected to the drain region of the polycrystalline silicon layer 504 through a contact hole, and the input terminal line 320 of the repair transmission gate is connected to the source region of the polycrystalline silicon layer 504 through a contact hole. The first, second, and third gate terminal connecting pieces 433, 443, and 453 are connected to the first, second, and third transmission gate scanning lines 430, 440, and 450 through contact holes 186, 187, and 188. The output terminal line 330 of the repair transmission gate is connected to the end repair line 402 through a contact hole 149, and the input terminal line 320 of the repair transmission gate is connected to the input repair line 401 through a contact hole 148.

A source electrode 322 of a first diode is connected to the Vdd line 420 and the source region of the polycrystalline silicon layer 505. A drain electrode 321 of a second diode is connected to the Vss line 410 and the drain region of the polycrystalline silicon layer 506. The input terminal line 320 of the repair transmission gate is connected to the drain region of the polycrystalline silicon layer 505 and the source region of the polycrystalline silicon layer 506 through the contact holes, while being connected to a gate electrode 421 of the second diode through a contact hole 183.

When the gate lines or data lines are disconnected in the TFT array panel having the above structure, such trouble can be solved with the following method.

For example, in the case when the data line 171 is disconnected, a laser beam is irradiate to short-circuit the disconnected data line 171 and the end repair line 402, and to short-circuit the input repair line 401 and the input line 310 of the transmission gate connected to the disconnected data line 171. Also, a laser beam is irradiated to short-circuit the gate terminal line 460 of the repair transmission gate and one of the first, second, and third gate terminal connecting pieces 433, 443, and 453 connected to the transmission gate scanning lines 430, 440, and 450 corresponding to the disconnected data line 171.

As a result, the image signals intending to be applied to the disconnected data line 171 are applied to the disconnected data line 171 through the repair lines 401 and 402.

Figure 6:
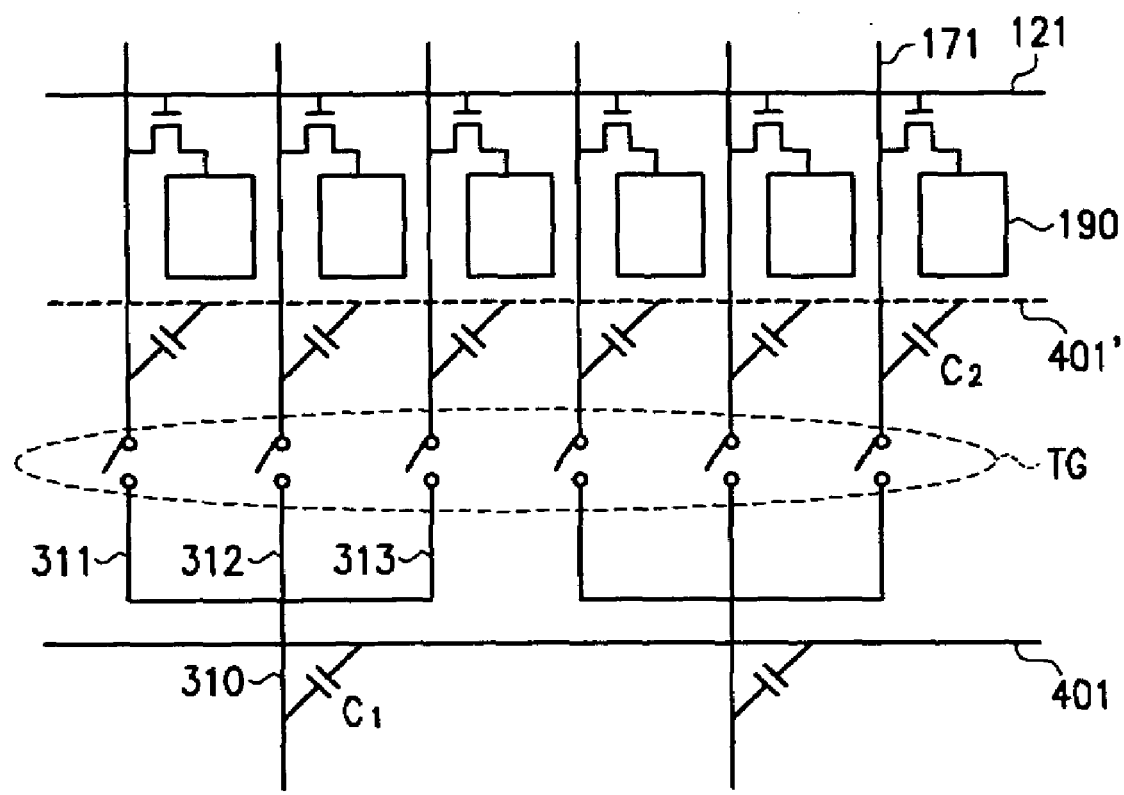
FIG. 6 is a circuit diagram of a thin film transistor array panel according to an embodiment of the present invention.

FIG. 6 is a circuit diagram of a thin film transistor array panel according to an embodiment of the present invention.

As shown in FIG. 6, in the TFT array panel of the present invention, the input repair line 401 is arrayed to intersect the input line 310 of the transmission gate, and thus a parasitic capacitance occurring between the input repair line 401 and input line 310 of the transmission gate is reduced. In the conventional TFT array, since a repair line 401' is provided in the output terminal of the transmission gate to intersect all data lines, a parasitic capacitance at the input repair line 401' is remarkably large. However, in the TFT array panel of the present invention, since the input repair line and the input line 310 of the transmission gate are intersected, the number of intersected wires is reduced by about a third, and thus the parasitic capacitance at the input repair line 401 is also reduced by about a third.

As mentioned above, the present invention can reduce the parasitic capacitance at the repair line by intersecting the input repair line and the input line of the transmission gate.

The present invention should not be considered to be limited to the particular examples described above, but rather should be understood to cover all aspects of the invention as fairly set out in the attached claims. Various modifications, equivalent processes, as well as numerous structures to which the may be applicable will be readily apparent to those of skill in the art to which the present invention is directed upon review of the instant specification.

What is claimed is:

1. A thin film transistor (TFT) array panel comprising:
   an insulating substrate;
   a plurality of gate lines horizontally provided on the insulating substrate;
   a plurality of data lines isolated from the gate lines and intersecting the plurality of gate lines;
   a plurality of pixel electrodes in pixel regions defined by intersecting the plurality of gate lines and the plurality of data lines;
   a plurality of TFTs for transmitting or intercepting an image signal transmitted through the plurality of data lines to the pixel electrodes in response to a scanning signal transmitted from the plurality of gate lines;
   a transmission gate for distributing the image signal input from an input line to the plurality of data lines; and
   a repair line intersecting the input line of the transmission gate.

2. The TFT array panel of claim 1, wherein the repair line includes an input repair line and an end repair line, and the TFT array panel further comprises a repair transmission gate for connecting the input repair line to the end repair line.

3. The TFT array panel of claim 2, wherein the length of a channel of the repair transmission gate is longer than that of a channel of the transmission gate.

4. The TFT array panel of claim 3, wherein the transmission gate includes a plurality of TFTs having each output terminal connected to each data line, each input terminal connected to an input line of the transmission gate, and each gate terminal connected to each scanning signal line of the transmission gate; and
   the repair transmission gate has an output terminal connected to the end repair line, an input terminal connected to the input repair line, and gate terminals overlapped with gate terminal connecting pieces connected to the transmission gate scanning signal lines.

5. The TFT array panel of claim 4, wherein the transmission gate has three input terminals which form a set and are connected to the input line of the transmission gate;
   the transmission gate scanning signal lines have three lines; and
   the transmission gate has three gate terminals corresponding to the three input terminals of the transmission gate, and they are connected to the three transmission gate scanning signal lines, respectively.

6. The TFT array panel of claim 5, wherein the number of gate terminal connecting pieces overlapped with the gate terminals of the repair transmission gate is three, and three gate terminal connecting pieces are connected to three transmission gate scanning signal lines, respectively.

7. The TFT array panel of claim 4, further comprising diodes for connecting the input line of the transmission gate and the input terminal of the repair transmission gate to a power supply line.

* * * * *